(12) United States Patent
Arai

(10) Patent No.: US 7,344,390 B2
(45) Date of Patent: Mar. 18, 2008

(54) INSTALLATION STRUCTURE OF PARALLEL WIRE ON BOARD

(75) Inventor: Akifumi Arai, Osaka (JP)

(73) Assignee: Funai Electric Co., Ltd., Daito-shi (JP)

( * ) Notice: Subject to any disclaimer, the term of this patent is extended or adjusted under 35 U.S.C. 154(b) by 0 days.

(21) Appl. No.: 11/606,467

(22) Filed: Nov. 29, 2006

(65) Prior Publication Data

US 2007/0155251 A1    Jul. 5, 2007

(30) Foreign Application Priority Data

Nov. 29, 2005    (JP) .............................. 2005-343713

(51) Int. Cl.
*H01R 12/00* (2006.01)
(52) U.S. Cl. ........................ 439/83; 439/496; 439/329; 29/629
(58) Field of Classification Search ............ 439/82–83, 439/496, 329; 29/629
See application file for complete search history.

(56) References Cited

U.S. PATENT DOCUMENTS 5,567,167 A * 10/1996 Hayashi ........................ 439/75
5,655,933 A *  8/1997 Skowronski ................ 439/654

FOREIGN PATENT DOCUMENTS

JP    2001-94242    4/2001

OTHER PUBLICATIONS

Patent Abstracts of Japan, Publication No. 2001-094242, Publication Date: Apr. 6, 2001, 2 pages.
Japanese Journal of Technical Disclosure No. 2001-2170, Publication Date: Apr. 16, 2001, 1 page.

* cited by examiner

*Primary Examiner*—Truc Nguyen
(74) *Attorney, Agent, or Firm*—Osha Liang LLP

(57) ABSTRACT

A parallel wire is installed on a board. Wire parts of strip-off margins at both ends of the parallel wire are bent so as to form bent portions before the wire parts are inserted into the board. The wire parts inserted into the board are prevented from being removed from the board by the bent portions and soldered to the board, while being moved in a dip bath. The bent portions are respectively formed into substantially U-shapes so that the substantially U-shaped bent portions are oriented opposite each other in a case where the parallel wire is in a flat state before the wire parts are inserted into the board and the substantially U-shaped bent portions are oriented in the same direction after the wire parts are inserted into the board, whereby solder uniformly accumulates on the wire parts to fix the wire parts to the board when the wire parts inserted into the board are moved in the dip bath in said direction.

5 Claims, 4 Drawing Sheets

INSTALLATION STRUCTURE OF PARALLEL WIRE ON BOARD

The disclosure of Japanese Patent Application No. 2005-343713 filed Nov. 29, 2005 including specification, drawings and claims is incorporated herein by reference in its entirety.

BACKGROUND OF THE INVENTION

This invention relates to an installation structure of a parallel wire on a board, wherein wire parts of strip-off margins at both ends of a parallel wire are bent before insertion into a board and the wire parts are prevented from slipping out at the bent portions for soldering in a dip bath when the wire parts are inserted into the board.

In an installation structure of a parallel wire on a board in a related art, wire parts 102 of strip-off margins at both ends of a parallel wire 101 are formed with bent portions 102a and 102b each of which are U-shaped, and bent in the same left-right direction, as shown in FIG. 3(a). If the respective wire parts 102 at both ends of the parallel wire 101 are inserted into a board 103, the bent portions 102a and 102b of the wire parts 102 are placed in the left-right opposite directions, as shown in FIG. 3(b). If solder 104 is put on the bent portions 102a and 102b (wire parts 102) by soldering in a dip bath, as shown in FIG. 3(c), the right bent portion 102b is not uniformly soldered and a solder break occurs, causing tunnel solder to occur, and the solder 104 does not uniformly accumulate on the bent portions 102a and 102b on both sides; this is a problem.

A first related art is shown in FIGS. 4(a), 4(b), and 4(c). The mounting structure of electronic parts in the first related art is a mounting structure of a mechanical switch 209 with terminals 209e and 209f soldered to a printed wiring board 210 by allowing the unit to flow into a soldering bath in a state in which the terminals 209e and 209f projected from the mechanical switch 209 are inserted into terminal attachment holes 210a formed on the printed wiring board 210, wherein the lower end parts of the terminals 209e and 209f projected from the terminal attachment holes 210a are bent ±90 degrees or less in the moving direction of the printed wiring board 210 with respect to the soldering bath. (For example, refer to Japanese Patent Publication No. 2001-94242.)

In the first related art, however, the terminals 209e and 209f of the electronic component are soldered and fixed to the printed wiring board 210 and a parallel wire is not installed in a board.

A second related art is shown in FIG. 5. In a parts mounting method on a board in the second related art, copper foil, a resist, an adhesive, or a combination thereof 308 is provided on a board 304 and a component 301 is floated from the board 304, as shown in FIG. 5. A bank 303 of air heated in a soldering bath 307 and expanded is released through the gap between the component 301 and the board 304. (For example, refer to Japanese Journal of Technical Disclosure No. 2001-2170.)

In the second related art, however, bent portions of left and right leads 302 of the component are bent in opposite directions to each other as in the installation structure of a parallel wire on a board in the related art described above and therefore solder does not uniformly accumulate on the leads 302; this is a problem.

SUMMARY OF THE INVENTION

It is therefore an object of the invention to provide an installation structure of a parallel wire on a board, wherein when a parallel wire is soldered to a board by moving in a dip bath, solder can uniformly accumulate on bent portions of wire parts at both ends of the parallel wire inserted into the board, whereby a solder break and tunnel solder can be prevented from occurring, and the wire parts can be uniformly and reliably soldered to the board for installation.

In order to achieve the above described object, according to the invention, there is provided an installation structure, comprising:

a parallel wire; and a board, on which the parallel wire installed, wherein:

wire parts of strip-off margins at both ends of the parallel wire are bent so as to form bent portions before the wire parts are inserted into the board;

the wire parts inserted into the board are prevented from being removed from the board by the bent portions and soldered to the board, while being moved in a dip bath; and the bent portions are respectively formed into substantially U-shapes so that the substantially U-shaped bent portions are oriented opposite each other in a case where the parallel wire is in a flat state before the wire parts are inserted into the board and the substantially U-shaped bent portions are oriented in the same direction after the wire parts are inserted into the board, whereby solder uniformly accumulates on the wire parts to fix the wire parts to the board when the wire parts inserted into the board are moved in the dip bath in said direction.

According to the invention, there is also provided an installation structure, comprising:

a parallel wire having wire parts of strip-off margins at both ends; and a board, into which the wire parts are inserted, wherein:

the wire parts are bent so as to form bent portions which are oriented in the same direction; and the wire parts are soldered to the board by moving in a dip bath in said direction so that solder uniformly accumulates on the wire parts to fix the wire parts to the board.

The bent portions may be respectively formed into substantially V-shapes.

According to the invention, there is also provided an installation method, comprising:

providing a parallel wire having wire parts of strip-off margins at both ends and a board;

bending the wire parts so as to form bent portions which are oriented opposite each other;

inserting the wire parts into the board so that the bent portions are oriented in the same direction; and soldering the wire parts to the board by moving in a dip bath in said direction so that solder uniformly accumulates on the wire parts to fix the wire parts to the board.

According to the invention, there is also provided a parallel wire, comprising:

a wire body, having a first end and a second end opposite to the first end;

a first wire parts, extended from the first end, bent so as to form a first bent portion; and a second wire parts, extended from the second end, bent so as to form a second bent portion, wherein:

the first bent portion and the second bent portion are oriented opposite each other in a case where the wire body is in a flat state.

With the above configurations, the bent portions of the wire parts at both ends of the parallel wire are oriented in the same direction as the dip direction when the wire parts are inserted into the board, so that the solder uniformly accumulates on the bent portions at the soldering time in the dip bath and thus a solder break and tunnel solder can be prevented from occurring. Accordingly, the wire parts can be uniformly and reliably soldered to the board for installation. Further, the bent portions are formed into U-shapes, so that the bent portions can be easily formed and moreover the solder can be allowed to easily accumulate.

With the above configurations, the bent portions may be formed into V-shapes, so that the bent portions can be easily formed.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF THE EMBODIMENTS

Embodiments of an installation structure of a parallel wire in a board according to the invention will be discussed with reference to the accompanying drawings.

Figure 1:
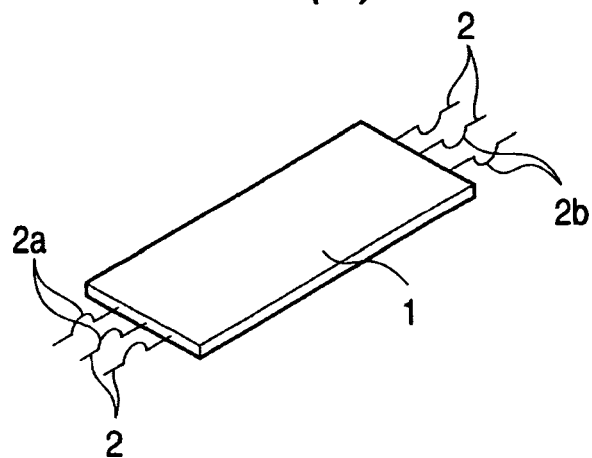
FIG. 1(a) is a perspective view of a parallel wire according to a first embodiment of the present invention.
FIG. 1(b) is a front view of an installation structure of the parallel wire on a board according to the first embodiment.
FIG. 1(c) is a front view of the installation structure according to the first embodiment.
Figure 1:
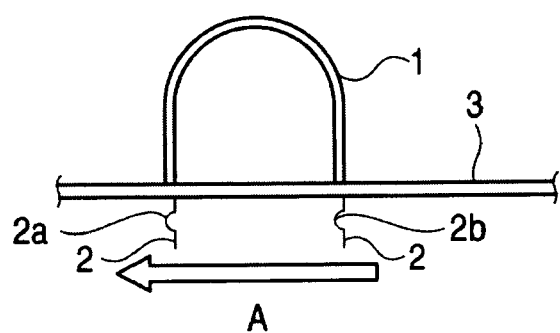
Figure 1:
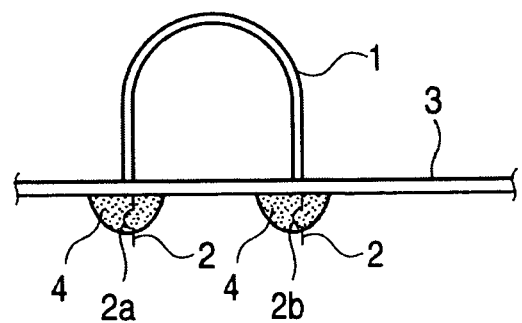

As shown in FIG. 1(a), according to a first embodiment, wire parts 2 of strip-off margins at both ends (a first end, a second end) of a parallel wire 1 (a wire body) are formed with bent portions 2a and 2b (a first bent portion, a second bent portion) each of which are U-shaped, bent in left-right opposite directions to each other. If the wire parts 2 at both ends of the parallel wire 1 are inserted into a board 3, the bent portions 2a and 2b of the wire parts 2 are placed in the same direction as a dip direction A, as shown in FIG. 1(b). Solder 4 uniformly accumulates on the wire parts 2a and 2b by soldering in a dip bath and the wire parts 2a and 2b are soldered to the board 3, as shown in FIG. 1(c).

Therefore, according to the first embodiment, the bent portions 2a and 2b of the wire parts 2 at both ends of the parallel wire 1 are placed in the same direction as the dip direction A when the wire parts 2 are inserted into the board 3, so that the solder 4 uniformly accumulates on the portions of the bent portions 2a and 2b of the wire parts 2 at the soldering time in the dip bath and thus a solder break and tunnel solder can be prevented from occurring. Accordingly, the wire parts 2 at both ends of the parallel wire 1 can be uniformly and reliably soldered to the board 3 for installation. Further, the bent portions 2a and 2b are U-shaped, so that the bent portions 2a and 2b can be easily formed and moreover the solder 4 can be allowed to easily accumulate.

Figure 2:
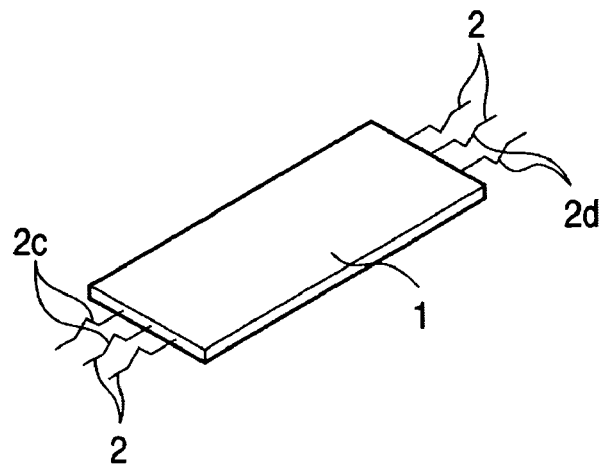
FIG. 2(a) is a perspective view of a parallel wire according to a second embodiment of the present invention.
FIG. 2(b) is a front view of an installation structure of the parallel wire on a board according to the second embodiment.
FIG. 2(c) is a front view of the installation structure according to the second embodiment.
Figure 2:
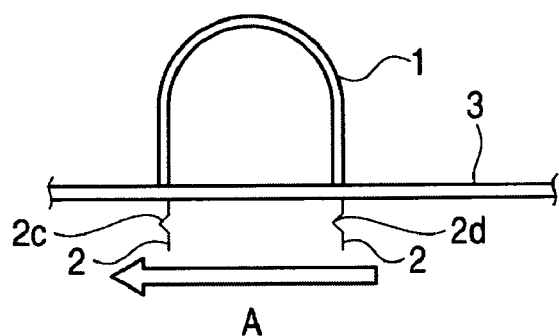
Figure 2:
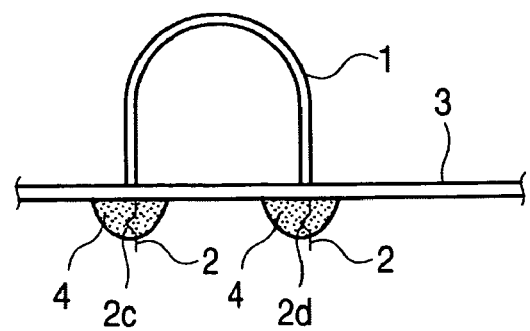
Figure 3:
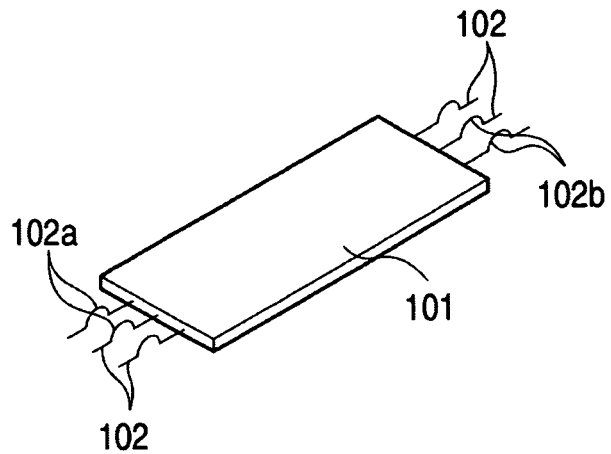
FIG. 3(a) is a perspective view of a parallel wire according to a related art.
FIG. 3(b) is a front view of an installation structure of the parallel wire on a board according to the related art.
FIG. 3(c) is a front view of the installation structure according to the related art.
Figure 3:
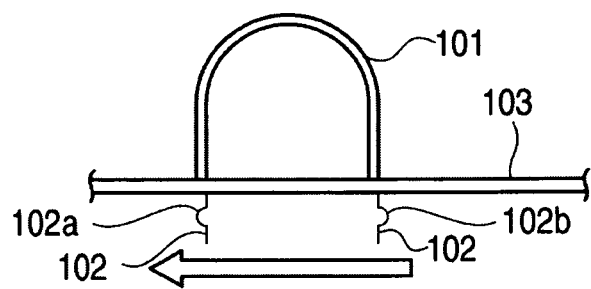
Figure 3:
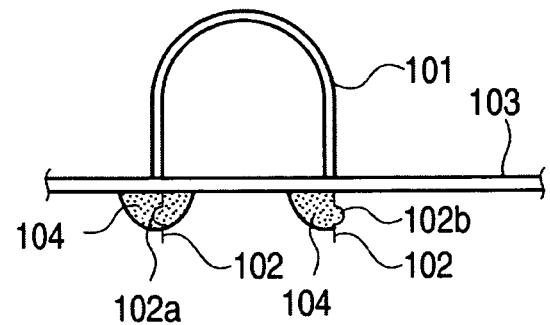
Figure 4:
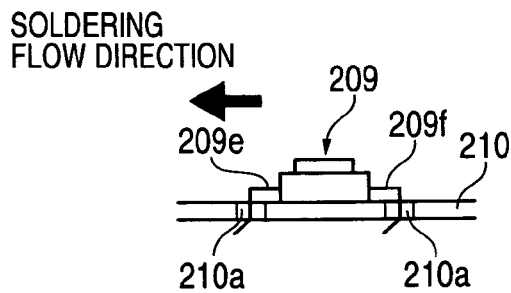
FIG. 4(a) is a section view of an installation structure according to a first related art.
FIG. 4(b) is a plan view of the installation structure according to the first related art.
FIG. 4(c) is a schematic diagram showing bend direction of terminals of switch according to the first related art.
Figure 4:
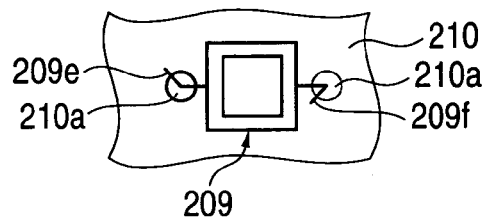
Figure 4:
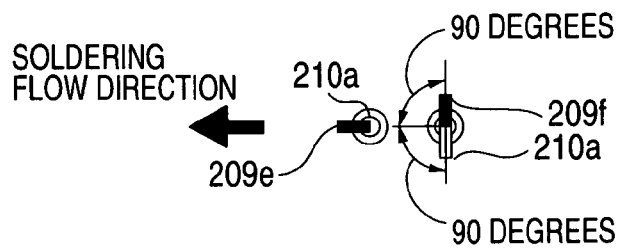
Figure 5:
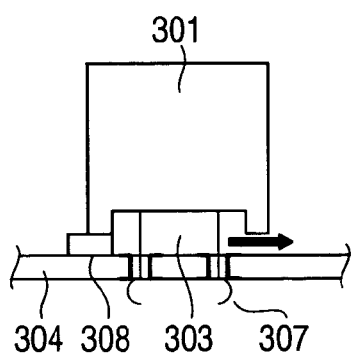
FIG. 5 is a section view of a parts mounting method on a board in a second related art.

According to a second embodiment, wire parts 2 of strip-off margins at both ends (a first end, a second end) of a parallel wire 1 (a wire body) are formed with bent portions 2c and 2d (a first bent portion, a second bent portion) each of which are V-shaped, bent in left-right opposite directions to each other, as shown in FIG. 2(a). If the wire parts 2 at both ends of the parallel wire 1 are inserted into a board 3, the bent portions 2c and 2d of the wire parts 2 are placed in the same direction as a dip direction A, as shown in FIG. 2(b). Solder 4 uniformly accumulates on the wire parts 2c and 2d by soldering in a dip bath and the wire parts 2c and 2d are soldered to the board 3, as shown in FIG. 2(c).

Therefore, according to the second embodiment, the bent portions 2c and 2d of the wire parts 2 each of which are V-shaped are placed in the same direction as the dip direction A when the wire parts 2 are inserted into the board 3, so that the solder 4 can be allowed to uniformly accumulate on the bent portions 2c and 2d at both ends at the soldering time in the dip bath and the wire parts 2 (bent portions 2c and 2d) can be uniformly and reliably soldered to the board 3 for installation. The bent portions 2c and 2d are V-shaped, so that the bent portions 2c and 2d can be easily formed.

What is claimed is:

1. An installation structure, comprising:

a parallel wire; and a board, on which the parallel wire is installed, wherein:

wire parts of strip-off margins at both ends of the parallel wire are bent so as to form bent portions before the wire parts are inserted into the board;

the wire parts inserted into the board are prevented from being removed from the board by the bent portions and soldered to the board, while being moved in a dip bath; and the bent portions are respectively formed into substantially U-shapes so that the substantially U-shaped bent portions are oriented opposite each other in a case where the parallel wire is in a flat state before the wire parts are inserted into the board and the substantially U-shaped bent portions are oriented in the same direction after the wire parts are inserted into the board, whereby solder uniformly accumulates on the wire parts to fix the wire parts to the board when the wire parts inserted into the board are moved in the dip bath in said direction.

2. An installation structure, comprising:

a parallel wire having wire parts of strip-off margins at both ends; and a board, into which the wire parts are inserted, wherein:

the wire parts are bent so as to form bent portions;

the bent portions are oriented opposite each other in a case where the parallel wire is in a flat state before the wire parts are inserted into the board and the bent portions are oriented in the same direction after the wire parts are inserted into the board; and the wire parts are soldered to the board by moving in a dip bath in said direction so that solder uniformly accumulates on the wire parts to fix the wire parts to the board.

3. The installation structure as set forth in claim 2, wherein:

the bent portions are respectively formed into substantially V-shapes.

4. An installation method, comprising:

providing a parallel wire having wire parts of strip-off margins at both ends and a board;

bending the wire parts so as to form bent portions which are oriented opposite each other;

inserting the wire parts into the board so that the bent portions are oriented in the same direction; and soldering the wire parts to the board by moving in a dip bath in said direction so that solder uniformly accumulates on the wire parts to fix the wire parts to the board.

5. A parallel wire, comprising:

a wire body, having a first end and a second end opposite to the first end;

a first wire parts, extended from the first end, bent so as to form a first bent portion; and a second wire parts, extended from the second end, bent so as to form a second bent portion, wherein:

the first and second wire parts are of strip-off margins, and the first bent portion and the second bent portion are oriented opposite each other in a case where the wire body is in a flat state before the wire parts are inserted into a board, and the first and second bent portions are oriented in the same direction after the wire parts are inserted into the board.

* * * * *